( 12 ) United States Patent
Yuan et al.

(10) Patent No.: US 9,203,383 B2
(45) Date of Patent: Dec. 1, 2015

(54) DIGITAL SOFT START WITH CONTINUOUS RAMP-UP

(71) Applicants: Henry H. Yuan, Fremont, CA (US); Steve X. Chi, Cupertino, CA (US); Ekram H. Bhuiyan, San Jose, CA (US)

(72) Inventors: Henry H. Yuan, Fremont, CA (US); Steve X. Chi, Cupertino, CA (US); Ekram H. Bhuiyan, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 250 days.

(21) Appl. No.: 13/827,601

(22) Filed: Mar. 14, 2013

(65) Prior Publication Data

US 2014/0266397 A1  Sep. 18, 2014

(51) Int. Cl.
*H03K 4/06* (2006.01)
*H03K 4/02* (2006.01)
*G05F 1/46* (2006.01)
*H02M 1/36* (2007.01)
*H02M 3/157* (2006.01)

(52) U.S. Cl.
CPC ........ *H03K 4/02* (2013.01); *G05F 1/468* (2013.01); *H02M 1/36* (2013.01); *H02M 3/157* (2013.01)

(58) Field of Classification Search
CPC ............ H03K 4/02; H03K 4/06; H03K 4/12; H03K 4/50; H05B 39/09; H02M 3/156; H02M 3/1588
USPC ................ 327/401, 131–140; 323/282, 222, 323/283–288
See application file for complete search history.

(56) References Cited

U.S. PATENT DOCUMENTS

| | | | | |
|---|---|---|---|---|
| 4,173,916 | A | * | 11/1979 | Inoue et al. ............... 84/679 |
| 4,988,857 | A | * | 1/1991 | Karasawa et al. ......... 250/205 |
| 6,316,926 | B1 | | 11/2001 | Savo et al. |
| 2006/0022648 | A1 | | 2/2006 | Ben-Yaakov et al. |
| 2007/0052403 | A1 | | 3/2007 | Stoichita |
| 2008/0238395 | A1 | | 10/2008 | Hasegawa |
| 2008/0266907 | A1 | * | 10/2008 | Kim et al. ............... 363/21.1 |
| 2009/0001946 | A1 | * | 1/2009 | Mehas et al. ............. 323/266 |
| 2009/0147550 | A1 | | 6/2009 | Yu |
| 2009/0273324 | A1 | * | 11/2009 | Okamoto et al. ......... 323/282 |
| 2012/0235657 | A1 | | 9/2012 | Ito et al. |

FOREIGN PATENT DOCUMENTS

JP     2005-354860    12/2005

OTHER PUBLICATIONS

International Search Report and Written Opinion for corresponding International application No. PCT/US2014/024616.

* cited by examiner

*Primary Examiner* — Lincoln Donovan
*Assistant Examiner* — Thomas Skibinski
(74) *Attorney, Agent, or Firm* — Brinks Gilson & Lione (57) ABSTRACT

A soft-start generation system is configured to generate a soft-start voltage. The soft-start generation system includes sawtooth circuitry configured to generate current having a sawtooth waveform and staircase circuitry configured to generate current having an ascending staircase waveform. A ramp-up current may be generated that is a combination of the sawtooth current and the staircase current. The ramp-up current may continuously ramp up to a predetermined current level. The soft-start voltage may be generated based on the ramp-up current.

20 Claims, 6 Drawing Sheets

DIGITAL SOFT START WITH CONTINUOUS RAMP-UP

BACKGROUND

Circuits, such as regulators or converters, receive power to power active components of the circuit. At start up, when the power is initially applied to the circuit, direct or immediate application of the power at a specified level may cause a power surge, which may damage components of the circuit and cause overshoot of a desired output voltage. To avoid these undesirable effects, a "soft-start" voltage that gradually rises to the specified level may be generated and applied to the circuit.

Some soft-start voltages may be analog, in which a current source may charge a capacitor, producing a relatively smooth and continuous soft-start voltage that increases to a specified or maximum level. The waveform of the analog soft-start voltage may be desirable or ideal due to its smooth and continuous shape. However, a large-sized capacitor is often required to produce the analog soft-start voltage. Due to its large size, the capacitor may be a component that is placed "off chip" or is located external to the circuit, which may increase the overall circuitry in both size and cost.

To generate a soft-start voltage "on chip" or internal to the circuit, the soft-start voltage may be generated as a digital soft-start voltage rather than as an analog soft-start voltage. The digital soft-start voltage may be generated using smaller-sized circuit components that may be integrated "on chip" or internal to the circuit. A conventional digital soft-soft start voltage may have a staircase waveform, which "steps up" in voltage over multiple time intervals. The staircase waveform of the digital soft-start voltage may be relatively discontinuous compared to the relatively smooth, continuous waveform of the analog soft-start voltage. Although generated internal to the circuit, the discontinuous waveform of the digital soft-start signal may be problematic. For example, the staircase waveform may cause an overshoot in the output voltage or some other problem or glitch in the circuit during start up. As such, it may be desirable to generate a digital soft-start voltage that has a smoother waveform similar to the waveform of an analog soft-start voltage, but that is generated using on-chip components.

SUMMARY

Embodiments of the present invention are defined by the claims, and nothing in this section should be taken as a limitation on those claims. By way of example, the embodiments described in this document and illustrated in the attached drawings generally relate to In one example, a soft-start generation system configured to generate a soft-start voltage may include sawtooth circuitry and staircase circuitry. The sawtooth circuitry may be configured to generate a sawtooth current having a sawtooth waveform. The staircase circuitry may be configured to generate a staircase current having an ascending staircase waveform. In addition, the soft-start generation system may include combination circuitry configured to combine the sawtooth current and the staircase current to generate a combined current. The combined current may continuously ramp up to a predetermined voltage level. The soft-start generation system may further include output circuitry configured to generate a soft-start voltage based on the combined current supplied from the combination circuitry.

In sum, the soft-start generation system may generate a soft-start voltage that has a continuous waveform. The continuous soft-start voltage may be generated using on-chip components, and may have a smoother waveform compared to other soft-start voltages generated on-chip.

These and other embodiments, features, aspects and advantages of the present invention will become better understood from the description herein, appended claims, and accompanying drawings as hereafter described.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Various modifications to and equivalents of the embodiments described and shown are possible and various generic principles defined herein may be applied to these and other embodiments. Thus, the claimed invention is to be accorded the widest scope consistent with the principles, features, and teachings disclosed herein.

The present description describes a soft-start generation system that is configured to generate a digital soft-start voltage for circuits or circuit systems that use a soft-start voltage at start-up or at other time periods of operation. The soft-start generation system may be configured to generate current having a sawtooth waveform and current having a staircase waveform. The soft-start generation system may further be configured to combine the sawtooth current with the staircase current. The combined current may have a relatively smooth waveform that continuously increases or "ramps up" to a predetermined or maximum level. The combined current may be provided to an output load to generate the soft-start voltage. The soft-start voltage generated by the soft-start generation system may have a waveform that more closely resembles a waveform of a conventional analog soft-start voltage, rather than a relatively discontinuous waveform of a conventional digital soft-start voltage.

Figure 1:
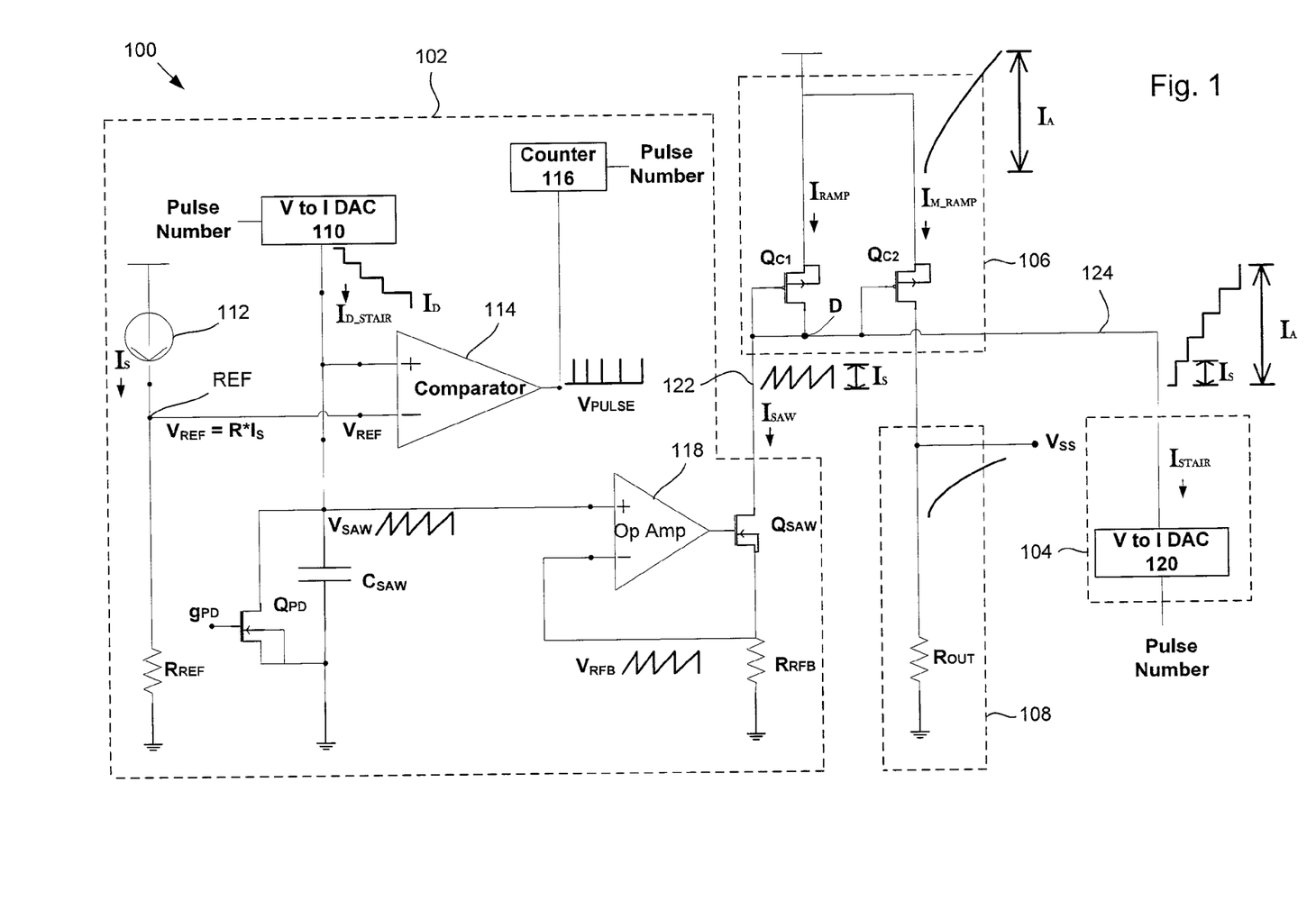
FIG. 1 is a schematic diagram of an example soft-start generation system.

FIG. 1 shows a schematic diagram of an example soft-start generation system 100 that is configured to generate and output a soft-start voltage $V_{SS}$. The soft-start generation system 100 may include sawtooth circuitry 102 that is configured to generate current having a sawtooth waveform, referred to as sawtooth current $I_{SAW}$. The soft-start generation system 100 may also include staircase circuitry 104 that is configured to generate a current having a staircase waveform, referred to as staircase current $I_{STAIR}$. The staircase current $I_{STAIR}$ may have an ascending waveform, as opposed to a descending waveform, as described in more detail below. The soft-start generation system 100 may further include combination circuitry 106 that is configured to combine the sawtooth current $I_{SAW}$ and the staircase current $I_{STAIR}$ to generate a combined current that smoothly and continuously increases or "ramps up." The combined current, referred to as ramp-up current $I_{RAMP}$, may be provided from the combination circuitry 106 to output circuitry 108 to generate the soft-start voltage $V_{SS}$.

Figure 2:
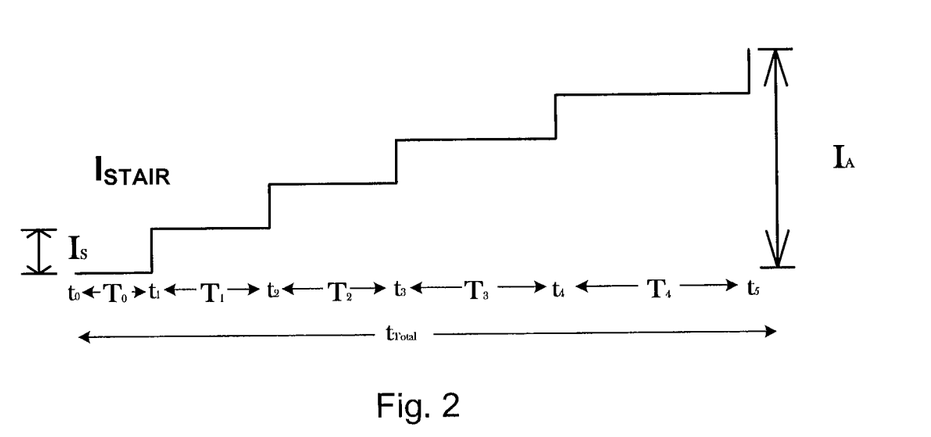
FIG. 2 is a graph of a staircase current waveform as a function of time.
Figure 3:
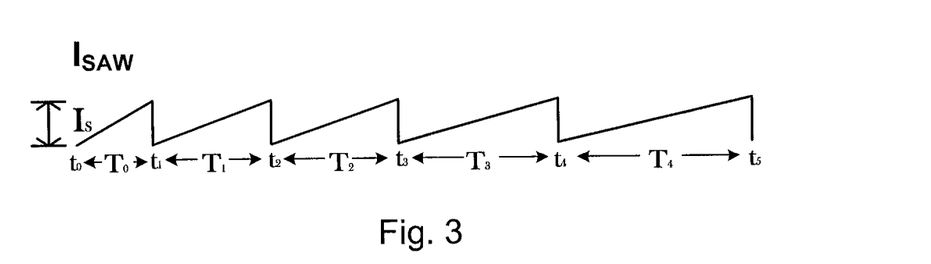
FIG. 3 is a graph of a sawtooth current waveform as a function of time.
Figure 4:
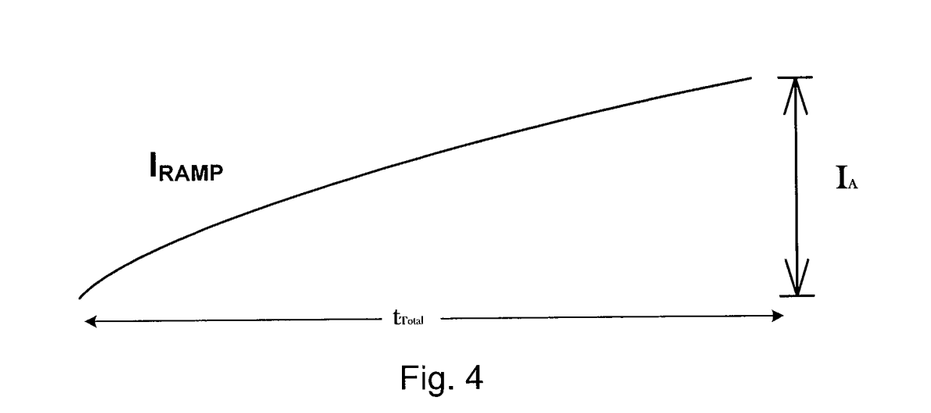
FIG. 4 is a graph of a continuous ramp-up current waveform as a function of time.

FIGS. 2, 3, and 4 show graphs of the staircase current $I_{STAIR}$, the sawtooth current $I_{SAW}$, and the continuous ramp-up current $I_{RAMP}$ as a function of time. In the graph shown in FIG. 2, the staircase current $I_{STAIR}$ has an ascending staircase waveform that increases or "steps up" to discrete current levels at particular step-up times $t_n$. The step-up characteristic of the staircase waveform may characterize the staircase waveform as being relatively discontinuous, as compared to the ramp-up current. In some example configurations, as shown in FIG. 2, the amount of current $I_S$ that the staircase current $I_{STAIR}$ increases at each step-up time $t_n$ (or the difference between each of the current levels) may be the same, although they may be different in alternative configurations. Additionally, as shown in FIG. 2, the staircase current $I_{STAIR}$ may increase to a final predetermined current level $I_A$, which may be proportional to a final predetermined voltage level of the soft-start output voltage $V_{SS}$. The staircase current $I_{STAIR}$ may step-up to the final current level $I_A$ over a plurality or N-number of time intervals or time periods, referred to as step-up intervals $T_n$. FIG. 2 shows five step-up intervals $T_0$ to $T_4$, although other numbers of step-up intervals may be used. A total number of step-up intervals $T_0$ to $T_{N-1}$ may determine a total time $t_{total}$ over which the staircase current $I_{STAIR}$ may increase to the final predetermined current level $I_A$.

The step-up interval $T_n$ in between each step-up in current may increase in duration over a plurality of cycles of the staircase current $I_{STAIR}$, each cycle being defined by a step-up interval $T_n$ in between step-up times $t_n$. The increase in duration of the step-up intervals $T_n$ from the first step-up interval $T_0$ to a last step-up interval $T_{N-1}$ may vary in nature, depending on the configuration. For some example configurations, the time duration may increase for each consecutive step-up interval $T_n$. For example the step-up interval $T_1$ may be greater than the step-up interval $T_0$, the step-up interval $T_2$ may be greater than the step-up interval $T_1$, and so on. In alternative example configurations, two or more consecutive step-up intervals $T_n$ may be the same or substantially the same in duration. In addition or alternatively, the increase in duration may have or be subjected to a pattern. For example, each increase may be an increase in a predetermined amount, or may be a percent increase, as examples. In general, the increase in time duration over the plurality of step-up intervals $T_n$ may be a general increase in which the last step-up interval $T_{N-1}$ is greater than the first step-up interval $T_0$. The nature in which the step-up intervals $T_n$ increase and/or the number of steps-up in current level at the step-up times $t_n$ may vary and may depend on a desired shape of the waveform of the ramp-up current, which may take into account the final current level $I_A$ and the total time $t_{Total}$ to reach that final level. Various configurations or combinations of configurations are possible.

FIG. 3 shows the sawtooth current $I_{SAW}$ as a function of time. The waveform of the sawtooth current $I_{SAW}$ may generally ramp up over a ramp-up period $T_n$ and drop sharply to a low or floor level, such as ground GND or a level corresponding to a logic "low," at drop-down times $t_n$. As shown in FIG. 3, the ramp-up period or interval $T_n$ in between each ramp-up time $t_n$ may increase in duration over a plurality of cycles of the sawtooth current $I_{SAW}$, each cycle being defined by a ramp-up interval $T_n$ in between drop-down times $t_n$. The drop-down times $t_n$ at which the sawtooth current $I_{SAW}$ drops to the floor level and the ramp-up intervals $T_n$ may by synchronized or be the same as the step-up times $t_n$ and the step-up intervals $T_n$ of the staircase current $I_{STAIR}$. In addition, the amount of current $I_S$ to which the sawtooth current $I_{SAW}$ ramps-up from the floor level may be the same or substantially the same as the difference in current levels $I_S$ of the staircase current $I_{STAIR}$.

FIG. 4 shows the ramp-up current $I_{RAMP}$ as a function of time, which may be a combination of the staircase current $I_{STAIR}$ and the sawtooth current $I_{SAW}$. The ramp-up current may increase to the final current level $I_A$ over a total time $t_{Total}$ as determined by the staircase current $I_{STAIR}$. In addition, the ramp-up current may continuously ramp-up in between current levels over the time intervals $T_n$ as determined by the sawtooth current $I_{SAW}$. In this way, the ramp-up current may be considered to have a relatively continuous waveform over the total time $t_{Total}$ because the current level of the ramp-up current continuously ramps-up over the time intervals $T_n$, as opposed to remaining constant over the time intervals $T_n$ and stepping-up to a next current level at the step-up times $t_n$ like the staircase current $I_{STAIR}$.

Referring back to FIG. 1, the sawtooth circuitry 102 may include a storage device or component, such as a capacitor $C_{SAW}$ that is configured to generate a sawtooth voltage $V_{SAW}$. The capacitor $C_{SAW}$ may include a single capacitor, multiple capacitors, and/or other types of capacitive or storage devices or components configured to store or discharge a charge, and generate a voltage in proportion to the stored charge. The sawtooth current $I_{SAW}$ may be generated based on the sawtooth voltage $V_{SAW}$. Descending staircase generation circuitry 110 may be included to supply a current $I_{D\_STAIR}$ having a descending staircase waveform to the capacitor $C_{SAW}$. The descending staircase generation circuitry 110 may include a voltage-to-current digital-to-analog converter (DAC), although other types of staircase generation circuits may be used. The descending staircase current $I_{D\_STAIR}$ may charge the capacitor $C_{SAW}$, which may generate the sawtooth voltage $V_{SAW}$ across the capacitor $C_{SAW}$. The descending staircase current $I_{D\_STAIR}$ may have constant discrete current levels over step-down time intervals $T_n$. The discrete current levels may begin at an initial current level and decrease or step down to lower current levels at step-down times $t_n$ in between the step-down intervals $T_n$. The amount of current $I_D$ that the descending staircase current $I_{D\_STAIR}$ steps down at each step-down time $t_n$ may be the same. Additionally, the step-down times $t_n$, and the step-down intervals $T_n$, of the descending staircase current $I_{D\_STAIR}$ may be synchronized with and/or be the same as the step-up times $t_n$, and the step-up intervals $T_n$, of the staircase signal generated by the staircase circuitry 104, as described above with reference to FIG. 2.

In response to receiving the descending staircase current $I_{D\_STAIR}$, the sawtooth voltage $V_{SAW}$ across the capacitor $C_{SAW}$ may increase or ramp up over each of the step-down intervals $T_n$. The sawtooth voltage $V_{SAW}$ may increase or ramp up from a low or a floor voltage value to a reference voltage level $V_{REF}$. The reference voltage level may be proportional to the change in current levels $I_S$.

In addition, the sawtooth voltage $V_{SAW}$ may sharply drop from the reference voltage $V_{REF}$ to a floor level at drop down times $t_n$ to further shape the sawtooth waveform. Because the sawtooth current $I_{SAW}$ may be based on the sawtooth voltage $V_{SAW}$, drop down times $t_n$ for the sawtooth voltage $V_{SAW}$ may be synchronized with or the same as the drop down times $t_n$ for the sawtooth current $I_{SAW}$.

To pull down the sawtooth voltage $V_{SAW}$, pull down circuitry may be included in the sawtooth circuitry 102 to pull down the sawtooth voltage $V_{SAW}$. In the example configuration shown in FIG. 1, the pull-down circuitry may include a pull down switch $Q_{PD}$ connected in parallel with the capacitor $C_{SAW}$ and tied to ground GND, although other configurations of the pull-down circuitry may be used. The pull down switch $Q_{PD}$ may be a n-channel metal-oxide-semiconductor field-effect transistor (NMOS). The pull down switch $Q_{PD}$ may switch between an "on" state and an "off" state. When the pull-down transistor $Q_{PD}$ is in the "on" state, the pull down switch $Q_{PD}$ may have a relatively low resistance or appear as a short circuit, which may "pull down" the voltage $V_{SAW}$ across the capacitor $C_{SAW}$ to the floor level, such as ground GND. Alternatively, when the pull-down switch $Q_{PD}$ is in the "off" state, the pull down switch $Q_{PD}$ may have a relatively high resistance or appear as an open circuit, in which the sawtooth voltage $V_{SAW}$ may be determined by the descending staircase current $I_{D\_STAIR}$ being supplied to the capacitor $C_{SAW}$.

The pull down transistor $Q_{PD}$ may be configured to receive a switching signal $g_{PD}$ that switches the pull down transistor $Q_{PD}$ "on" and "off." The switching signal $g_{PD}$ may be a pulsed signal having pulse of a short duration or a short pulse width. The pulse of the pulsed signal may occur at the drop down times $t_n$ so that the sawtooth voltage $V_{SAW}$ is pulled down at the down times $t_n$.

The sawtooth circuitry 102 may further include circuitry to control generation of the descending staircase current $I_{D\_STAIR}$. In particular, the sawtooth circuitry 102 may include a current source 112 that is configured to supply an amount of current $I_S$, which is the amount of current that the staircase current $I_{STAIR}$ increases and the descending staircase current decreases at each step-up and step-down time $t_n$. The current $I_S$ may be supplied to a reference resistor $R_{REF}$, which may generate the reference voltage level $V_{REF}$ (i.e., the voltage level to which the sawtooth voltage $V_{SAW}$ ramps up) at node REF.

The sawtooth circuitry 102 may further include a comparator 114, that is used to determine when the voltage $V_{SAW}$ across the capacitor $C_{SAW}$ increases to the reference voltage $V_{REF}$. The comparator 114 may include a first input terminal, which may be a negative input terminal, that receives the reference voltage $V_{REF}$. The comparator 114 may also include a second input terminal, which may be a positive input terminal of the comparator 114, that receives the sawtooth voltage $V_{SAW}$. The output of the comparator 114 may be a pulsed signal $V_{PULSE}$ having a pulse of short duration. The comparator 114 may be configured to output the pulse $V_{PULSE}$ when the sawtooth voltage $V_{SAW}$ ramps up to or reaches the voltage reference $V_{REF}$.

The output pulse $V_{PULSE}$ of the comparator 114 may be used to pull down the sawtooth voltage $V_{SAW}$ with the pull down transistor $Q_{PD}$. In particular, the output of the comparator 114 may be coupled to the pull down transistor $Q_{PD}$ such that the switching signal $g_{PD}$ may be proportional to the pulsed signal $V_{PULSE}$. When the sawtooth voltage $V_{SAW}$ reaches the threshold voltage $V_{REF}$, the comparator 114 may output the pulse $V_{PULSE}$, which may turn "on" the pull down transistor $Q_{PD}$, driving down the sawtooth voltage $V_{SAW}$ across the capacitor. Alternatively, when the sawtooth voltage $V_{SAW}$ is below the threshold voltage $V_{REF}$, then the pulse $V_{PULSE}$ may not be output from the comparator 114, which turns "off" the pull down transistor $Q_{PD}$, allowing the descending staircase current $I_{D\_STAIR}$ to charge the capacitor $C_{SAW}$ and the sawtooth voltage $V_{SAW}$ to ramp up.

The output pulse $V_{PULSE}$ may also be used to control when the descending staircase current $I_{D\_STAIR}$ steps down in current levels. In particular, the output of the comparator 114 may be coupled to a counter 116, such as a digital counter, which may receive the output pulse $V_{PULSE}$ from the comparator 114. The digital counter 116 may track or count the number of the output pulses $V_{PULSE}$ that it receives from the comparator 114, and may output a value, such as a digital value, that is indicative of that tracked or counted number of pulses. The digital value may be an n-bit value, such as an 8-bit, 16-bit, or 32-bit value indicative of a counted number of pulses $V_{PULSE}$. To illustrate, upon receipt of a first pulse $V_{PULSE}$ from the comparator 114, the digital counter 116 may output an 8-bit digital value "000" that is indicative of the first pulse, and upon receipt of a second pulse from the comparator 114, the digital counter 116 may output an 8-bit digital value "001" indicative of the second pulse. Various alternative configurations of circuitry suitable to count pulses and generate digital values are contemplated.

The pulse number value output by the digital counter 116 may be sent to the voltage-to-current DAC 110. Upon receipt of the pulse number value from the digital counter, the voltage-to-current DAC 110 may output the descending staircase current $I_{D\_STAIR}$ at a current level that corresponds to the received pulse number value. An inverse relationship may exist between the number of pulses $V_{PULSE}$ and the current level of the descending staircase current $I_{D\_STAIR}$. That is, as the number of pulses increases, the current level of the descending staircase current $I_{D\_STAIR}$ may decrease. As the current level of the descending staircase current $I_{D\_STAIR}$ decreases, the amount of time needed for the sawtooth voltage $V_{SAW}$ to ramp up to the reference voltage $V_{REF}$ may increase because there is a lesser amount of current charging the capacitor $C_{SAW}$. As such, the ramp-up intervals $T_n$ in between each of the drop down times $t_n$ for the voltage $V_{SAW}$, as well as the time in between each of the output pulses $V_{PULSE}$, may continually increase as the current level of the descending staircase current $I_{D\_STAIR}$ decreases. Where the descending staircase current $I_{D\_STAIR}$ steps down by a current amount $I_D$ at each step down time $t_n$, the ramp-up intervals $T_n$ may continually increase by an amount that is proportional to the amount of current $I_D$.

Figure 5:
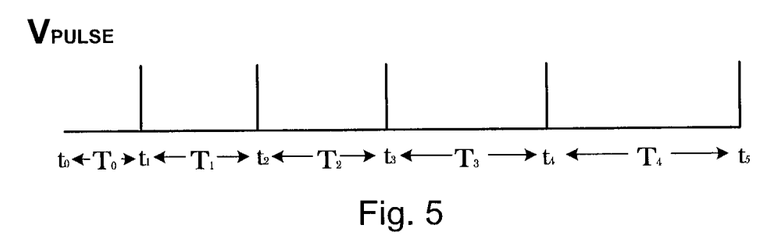
FIG. 5 is a graph of pulsed output as a function of time.
Figure 6:
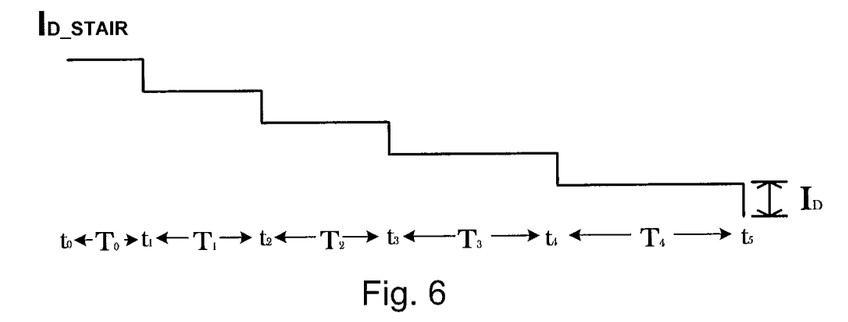
FIG. 6 is a graph of a descending staircase waveform as a function of time.
Figure 7:
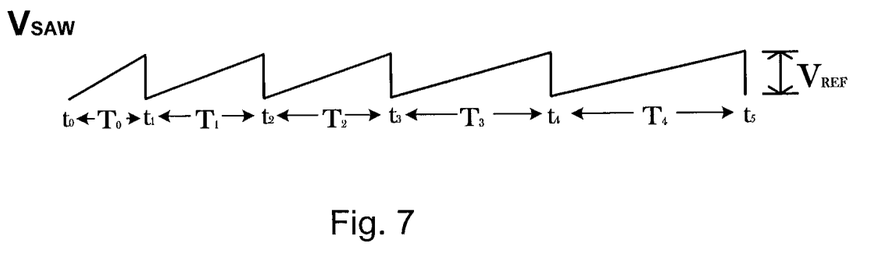
FIG. 7 is a graph of a sawtooth voltage waveform as a function of time.

FIGS. 5, 6, and 7 show graphs of the output pulse $V_{PULSE}$, the descending staircase current $I_{D\_STAIR}$, and the sawtooth voltage $V_{SAW}$ as a function of time. As the comparator 114 outputs an output pulse $V_{PULSE}$ (FIG. 5), the descending staircase current $I_{D\_STAIR}$ steps down in current by an amount of current $I_D$ (FIG. 6), and the sawtooth voltage $V_{SAW}$ sharply drops down from the reference voltage $V_{REF}$ to a floor level (FIG. 7). Because the descending staircase current $I_{D\_STAIR}$ decreases in current level, the ramp-up interval $T_n$ for the sawtooth voltage $V_{SAW}$ increases for each successive ramp-up interval $T_n$. The time duration in between the output pulses $V_{PULSE}$ and the time that the descending staircase current $I_{D\_STAIR}$ maintains a current level, also increase accordingly.

Referring back to FIG. 1, the sawtooth circuitry 102 may include an op-amp 118 that receives the sawtooth voltage $V_{SAW}$, such as at a positive input terminal. An output of the op-amp 118 may drive a transistor $Q_{SAW}$, such as a NMOS transistor, in accordance with the sawtooth voltage $V_{SAW}$, causing the sawtooth current $I_{SAW}$ to flow from drain to source terminals of the NMOS transistor $Q_{SAW}$. A feedback voltage $V_{RFB}$ generated at the output of the op-amp 118 may be fed back to a negative input terminal of the op-amp 118 to regulate the output of the op-amp and the sawtooth current $I_{SAW}$ being drawn through the transistor $Q_{SAW}$. In particular, a feedback resistor $R_{RFB}$ may be connected to the source terminal of the NMOS transistor $Q_{SAW}$, and the feedback voltage $V_{RFB}$ may be generated across the feedback resistor $R_{RFB}$. The feedback resistor $R_{RFB}$ may have the same or substantially the same resistance as the reference resistor $R_{REF}$. By setting the feedback resistor $R_{RFB}$, the sawtooth current $I_{SAW}$ may be regulated to ramp up to the current level $I_S$, which is the amount of current supplied by the current source 112 and the amount of current that the staircase current increases at each step-up time $t_n$.

The staircase circuitry 104 may include a second or ascending staircase generation circuitry 120 that is configured to generate the staircase current $I_{STAIR}$. The ascending staircase generation circuitry 120 may include a voltage-to-current DAC 120, although other types of staircase generation circuits may be used. As shown in FIG. 3, the staircase current $I_{STAIR}$ may be an ascending staircase current that increases in magnitude at each step up time $t_n$, as opposed to the descending staircase current $I_{D\_STAIR}$ generated by the voltage-to-current DAC 110, which decreases in magnitude. Like the voltage-to-current DAC 110, the voltage-to-current DAC 120 may also be configured to receive the pulse number value from the digital counter 116 indicative of the number of pulses $V_{PULSE}$ output by the comparator 114. In this way, the output pulse $V_{PULSE}$ may also be used to control when the ascending staircase current $I_{STAIR}$ steps up in current levels. Upon receipt of the pulse number value from the digital counter 116, the voltage-to-current DAC 120 may output the ascending staircase current $I_{STAIR}$ at a current level that corresponds to the received pulse number value. A direct relationship may exist between the number of pulses $V_{PULSE}$ and the current level of the ascending staircase current $I_{STAIR}$. That is, as the number of pulses increases, the current level of the ascending staircase current $I_{STAIR}$ may increase.

Although the ascending staircase current $I_{STAIR}$ generated by the voltage-to-current DAC 120 may increase in magnitude, the staircase current $I_{STAIR}$ may be negative in polarity, in which the general current flow of the staircase current $I_{STAIR}$ may flow toward the voltage-to-current DAC 120. The staircase current $I_{STAIR}$ may have a negative polarity to flow toward the voltage-to-current DAC 120 so that the staircase current $I_{STAIR}$ may be combined with the sawtooth current $I_{SAW}$.

The sawtooth circuitry 102 and the staircase circuitry 104 may generate the sawtooth current $I_{SAW}$ and the staircase current $I_{STAIR}$ by inducing a current source to generate and supply the sawtooth and staircase currents $I_{SAW}$, $I_{STAIR}$. For example, driving the transistor $Q_{SAW}$ may induce a current source to generate and supply the sawtooth current $I_{SAW}$. Similarly, the voltage-to-current DAC 120 may induce a current source to generate and supply the staircase current $I_{STAIR}$. As described above, the sawtooth and staircase currents $I_{SAW}$, $I_{STAIR}$, when combined, may produce a continuous, ramp-up current $I_{RAMP}$. As such, the sawtooth circuitry 102 and the staircase circuit 104, together, may induce a current source to generate a combined current that combines the sawtooth current $I_{SAW}$ and the staircase current $I_{STAIR}$. The current source may then source or supply the combined current to a circuit node in the system. The sawtooth circuitry 102 may draw the sawtooth portion of the combined current away from the node, and the staircase circuitry 104 may draw the staircase portion of the combined current away from the node. In this way, the sawtooth circuitry 102 and the staircase circuitry 104 each function as current sinks to generate the continuous ramp-up current $I_{RAMP}$.

In an example implementation, as shown in FIG. 1, the combination circuitry 106 may be configured to function as the current source that generates and supplies the combined current $I_{RAMP}$. In particular, the combination circuitry may include a first transistor $Q_{C1}$ to generate the continuous ramp-up current $I_{RAMP}$, which may be a combination of the sawtooth current $I_{SAW}$ and the staircase current $I_{STAIR}$. The first transistor $Q_{C1}$, which may be a p-channel MOS (PMOS) transistor, may be induced by the sawtooth circuitry 102 and the staircase circuitry 104 to generate the continuous ramp-up current $I_{RAMP}$. The continuous ramp-up current $I_{RAMP}$ may be configured to flow between the source and drain terminals of the PMOS transistor $Q_{C1}$. The PMOS transistor $Q_{C1}$ may also be configured to supply the continuous ramp-up current $I_{RAMP}$ to a circuit node D that may be connected to a terminal, such as a drain terminal, of the PMOS transistor $Q_{C1}$. At node D, a sawtooth current portion of the ramp-up current $I_{RAMP}$ (i.e., the sawtooth current $I_{SAW}$) may be drawn away from node D and flow through a sawtooth current path 122, as induced by the sawtooth circuitry 102. In addition, at node D, a staircase current portion of the ramp-up current $I_{RAMP}$ (i.e., the staircase current $I_{STAIR}$), may be drawn away from node D and flow through a staircase current path 124, as induced by the staircase circuitry 104.

The combination circuitry 106 may further include current mirroring circuitry that may be configured to mirror the ramp-up current $I_{RAMP}$ generated by the first transistor $Q_{C1}$ and supply the mirrored current $I_{M\_RAMP}$ to the output circuitry. The current mirroring circuitry may include a second transistor $Q_{C2}$, which may also be a PMOS transistor. To mirror the ramp-up current $I_{RAMP}$ flowing through the first PMOS $Q_{C1}$, the gate terminals for both the first and second PMOS transistors $Q_{C1}$ and $Q_{C2}$ may be connected to the drain terminal of the first PMOS transistor $Q_{C1}$, and the source terminals for both the first and second PMOS transistors $Q_{C1}$ and $Q_{C2}$ may be connected to DC voltage source $V_{cc}$ to that the gate-to-source voltages for the first and second transistors $Q_{C1}$ and $Q_{C2}$ are the same. The second transistor $Q_{C2}$ may then supply the mirrored ramp-up current $I_{M\_RAMP}$ to the output circuitry 108 for generation of the soft-start voltage $V_{SS}$.

The output circuitry 108 may include an output resistor $R_{OUT}$ connected to the drain terminal of the second PMOS transistor $Q_{C2}$. The mirrored ramp-up current generated by the second PMOS transistor $Q_{C2}$ may be supplied to the output resistor $R_{OUT}$, which may generate the soft-start voltage $V_{SS}$. The resistance of the output resistor $R_{OUT}$ may be any amount generate a desired or predetermined soft-start voltage level when the ramp-up current flows through the output resistor $R_{OUT}$. In some example configurations, the output resistor $R_{OUT}$ may be of an order that is about fifty times less than the resistance of the reference resistor $R_{REF}$ and the feedback resistor $R_{RFB}$. For example, the reference resistor $R_{REF}$ and the feedback resistor $R_{RFB}$ may be about 50,000 Ohms (50 kΩ), and the output resistor $R_{OUT}$ may be about 1 kΩ, although other resistance values may be used. In addition or alternatively, the output circuitry 108 may not be limited to a single resistor, such as the output resistor $R_{OUT}$. Alternative configurations of the output circuitry 108 may include multiple resistors and/or other types of output loads that may be configured to receive the ramp-up current to generate and output a continuous soft-start voltage.

The soft start voltage $V_{SS}$ generated by the example soft-start generation system 100 may be supplied to any circuit or system that may be configured to receive a soft start voltage, such as during a start up operation of the circuit. In addition, the soft-start generation system 100 may be integrated with or included "on chip" or as part of the same integrated circuit (IC) as the circuit receiving the soft start voltage. By being included "on chip," the soft-start generation system 100 may be considered internal to or an internal circuit component of the circuit receiving the soft start voltage $V_{SS}$, as opposed to an external circuit component.

Figure 8:
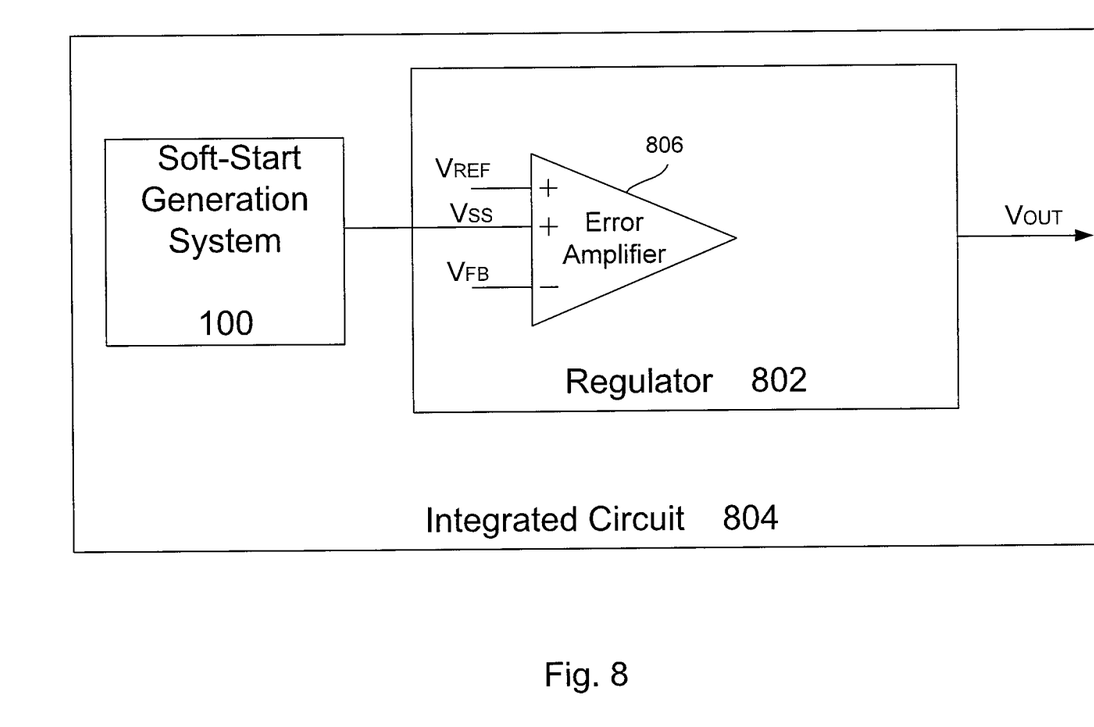
FIG. 8 is a schematic diagram of the example soft-start generation system shown in FIG. 1 included with a regulator.

An example circuit that may receive a soft start voltage may be a regulator. FIG. 8 shows a block diagram of a regulator 802 that is configured to generate a regulated DC output voltage $V_{OUT}$. The regulator 802 may be included "on chip" as part of an integrated circuit 804. The regulator 802 may include an error amplifier 806 that is used to compare the output voltage $V_{OUT}$, which may be fed back to the error amplifier 806 as voltage $V_{FB}$ with a reference voltage $V_{REF}$ to control and/or adjust a regulator circuitry used to generate the output voltage $V_{OUT}$. At start up, the output voltage $V_{OUT}$ may be initially zero volts, causing the reference voltage $V_{REF}$ to dominate operation of the error amplifier 806, which in turn may cause overshoot in the output voltage $V_{OUT}$ and possible damage to components of the regulator 802. To avoid dominant operation of the reference voltage $V_{REF}$ at start up, a soft start voltage that gradually and continuously increases to the reference voltage $V_{REF}$ may be input to the error amplifier 806.

The soft-start generation system 100 shown in FIG. 1 may be included "on chip" or as part of the integrated circuit 804 with the regulator 802 and provide the soft start voltage $V_{SS}$ as an input to the error amplifier 806. In alternative example configurations, the soft-start generation system 100 may be included "off chip" or external to the regulator 802 and/or the integrated circuit 804, which still being configured to provide the soft start voltage $V_{SS}$ to the regulator 802.

The soft-start voltage $V_{SS}$ generated by the soft-start generation system may be considered or referred to as a digital soft-start voltage $V_{SS}$ despite its relatively continuous waveform because it is generated with digital to analog converters, staircase currents, a digital counter, and/or some combination thereof. In addition or alternatively, the soft-start voltage $V_{SS}$ may be considered a digital soft start voltage because it may be generated with circuit components that may be included or fabricated on an integrated circuit or chip.

Figure 9:
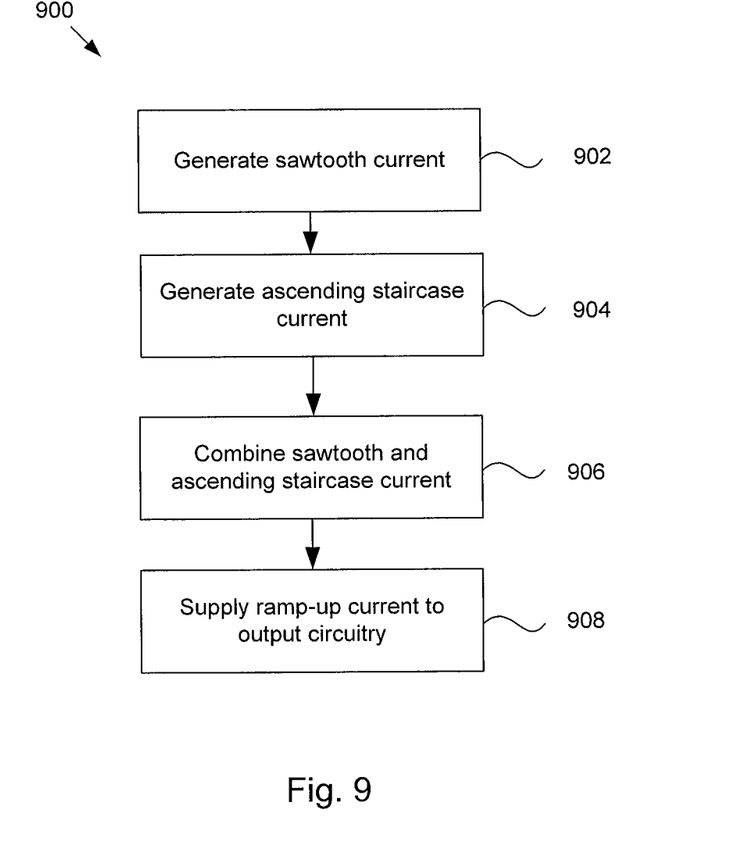
FIG. 9 is a flow chart of an example method of generating a soft-start voltage.

FIG. 9 shows a flow diagram of an example method 900 of generating a soft-start voltage. At block 902, sawtooth circuitry may generate a first current having a sawtooth waveform. The sawtooth waveform may ramp up to a reference current level over a plurality of ramp-up periods or intervals. The ramp-up periods may increase in duration over subsequent ramp-up periods. At block 904, staircase circuitry may generate a second current having an ascending staircase waveform. The second current may step up at step-up times by an amount of current that is the same or substantially the same as the reference current level. In addition, the time periods or intervals in between the step-up times may be synchronized with or be the same as the ramp-up intervals over which the sawtooth current ramps up to the reference current level.

At block 906, combination circuitry may combine the sawtooth current and the staircase current to generate a combined current, which may have a continuous ramp-up waveform. At block 908, the ramp-up current may be supplied to output circuitry, where the soft-start voltage may be generated.

Figure 10:
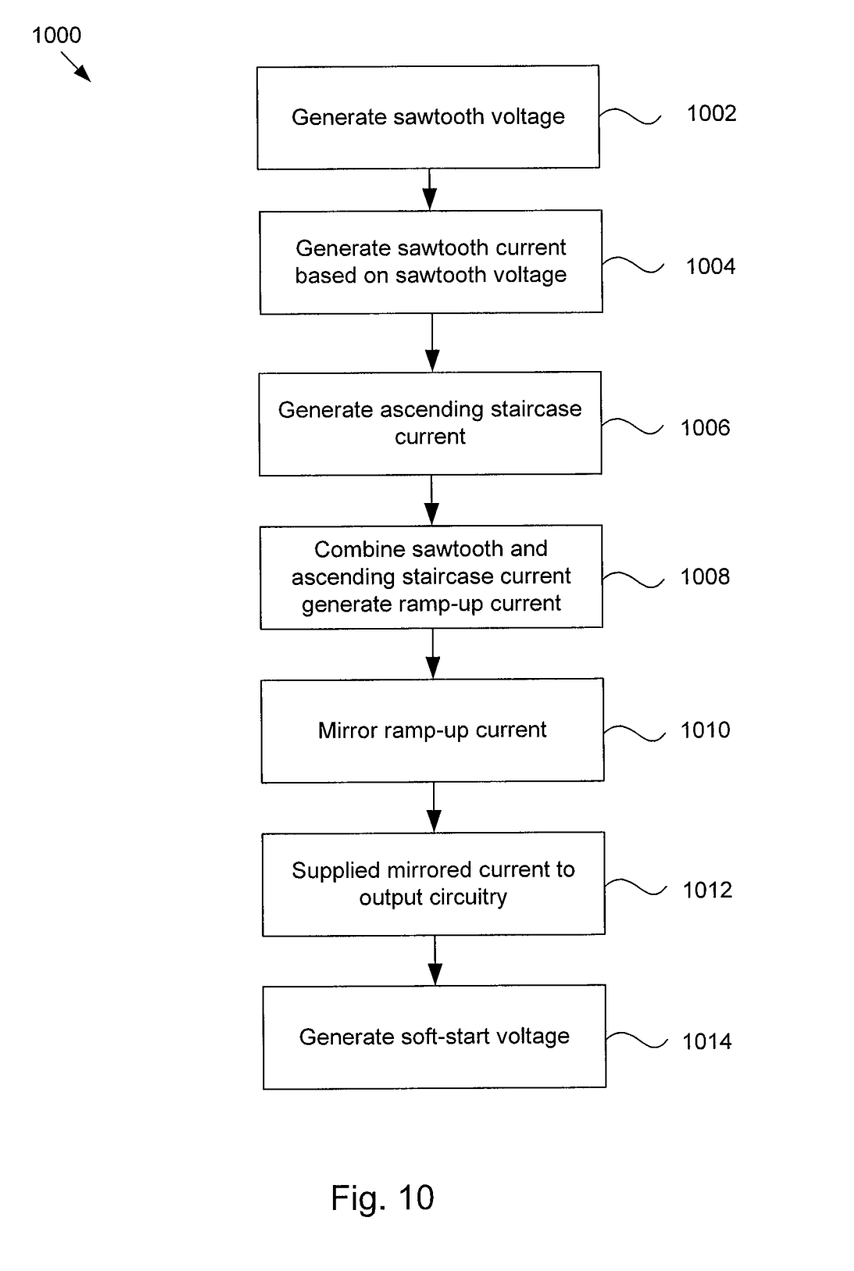
FIG. 10 is a flow chart of an alternative example method of generating a soft-start voltage.

FIG. 10 shows a flow diagram of an alternative example method 1000 of generating a soft-start voltage. At block 1002, a voltage having a sawtooth waveform may be generated across a capacitor. The sawtooth voltage may be generated by supplying a current having a descending staircase waveform that steps down in current levels at a plurality of step down times to generate the sawtooth voltage, while pulling down the sawtooth voltage to a floor level at the step down times, such as by using a switch in parallel with the capacitor. At block 1004, a current having a sawtooth waveform may be generated based on the sawtooth voltage. The sawtooth current may be generated by driving a transistor with the sawtooth voltage or with a voltage generated from and/or proportional to the sawtooth voltage. For example, an op-amp may receive the sawtooth voltage and output an output voltage that drives or biases the transistor, which may induce the sawtooth current through the drain and source terminals of the transistor. The induced sawtooth current may be drawn from a current source, such as a transistor, that is supplying the sawtooth current.

At block 1006, a current having an ascending staircase waveform that steps up in current levels at a plurality of step up times may be generated. The step up times may be the same or synchronized with the step down times of the descending staircase current. In addition, the current in which the ascending staircase steps up may be the same as or correspond to the current levels in which the descending staircase steps down. Also, the ascending staircase current may have a negative polarity so that the ascending staircase current may be drawn or flow from a current source, such as a transistor, to circuitry generating the ascending staircase current, such as a voltage-to-current DAC. Otherwise stated, the voltage-to-current DAC may induce the ascending staircase current from the current source. The current source supplying the ascending staircase current may the same as the current source supplying the sawtooth current.

At block 1008, a combined current that is a combination of the sawtooth current and the staircase current may be generated, such as by the current source that is supplying the ascending staircase and sawtooth currents. The combined current may have a waveform that continuously ramps up to a predetermined level, and in a manner that may be suitable or desirable for a soft-start voltage as determined by the ascending staircase and sawtooth current waveforms. The continuous ramp-up current may be generated in response the transistor that is inducing flow of the sawtooth current at block 1004 and the voltage-to-current DAC inducing flow of the ascending staircase current at block 1006. In addition, at block 1008, the continuous ramp up current may be supplied to a node connected to the current source, where the sawtooth portion of the combined current may be supplied along a sawtooth current path to the transistor inducing the sawtooth current, and where the ascending staircase portion of the combined current may be supplied along a staircase current path to the voltage-to-current DAC inducing flow of the ascending staircase current.

At block 1010 the continuous ramp-up current may be mirrored using current mirror circuitry. At block 1012, the mirrored continuous ramp-up current may be supplied to output circuitry that includes an output load, such as a resistor. At block 1014, the soft-start voltage may be generated using the continuous ramp-up current being supplied to the output load.

It is intended that the foregoing detailed description be understood as an illustration of selected forms that the embodiments can take and does not intend to limit the claims that follow. Also, some of the following claims may state that a component is operative to perform a certain function or configured for a certain task. It should be noted that these are not restrictive limitations. It should also be noted that the acts recited in the claims can be performed in any order—not necessarily in the order in which they are recited. Additionally, any aspect of any of the preferred embodiments described herein can be used alone or in combination with one another. In sum, although the present invention has been described in considerable detail with reference to certain embodiments thereof, other versions are possible. Therefore, the spirit and scope of the appended claims should not be limited to the description of the embodiments contained herein.

We claim:

1. A system comprising:
sawtooth circuitry configured to generate a sawtooth current having a sawtooth waveform;
staircase circuitry configured to generate a staircase current having an ascending staircase waveform; and
combination circuitry configured to combine the sawtooth current and the staircase current to generate a combined current that continuously ramps up to a predetermined level.

2. The system of claim 1, wherein the sawtooth circuitry comprises:
a storage device configured to generate a sawtooth voltage having a sawtooth waveform; and
a transistor configured to generate the sawtooth current.

3. The system of claim 2, wherein the sawtooth circuitry further comprises:
descending staircase generation circuitry configured to supply a descending staircase current to the storage device, the descending staircase current having a descending staircase waveform that steps down in current levels at a plurality of step-down times; and
pull-down circuitry configured to pull down the sawtooth voltage across the storage device to a floor voltage level at a plurality of pull-down times, the plurality of pull-down times being synchronized with the step-down times,
wherein the sawtooth waveform of the sawtooth voltage is generated in response to receipt of the descending staircase current and the sawtooth voltage being pulled down to the floor voltage level by the pull-down transistor.

4. The system of claim 3, wherein the sawtooth circuitry further comprises:
a comparator configured to:
compare the sawtooth voltage with a reference voltage level; and
output a pulsed signal in response to a voltage level of the sawtooth voltage reaching the reference voltage level,
wherein the pull-down circuit is configured to pull down the sawtooth voltage to the floor voltage level in response to output of the pulsed signal.

5. The system of claim 4, wherein the sawtooth circuitry further comprises:
a digital counter coupled to the comparator, the digital counter configured:
to count a number of pulses in the pulsed signal output by the comparator; and
output a pulse number value indicative of the number of pulses,
wherein the descending staircase generation circuitry is configured to output the descending staircase current at a current level that corresponds to the pulse number value.

6. The system of claim 1, wherein the combination circuitry comprises a first transistor that is configured to generate the combined current and supply the combined current to a node,
wherein generation of the sawtooth current and the staircase current induces the first transistor to generate the combined current,
wherein a sawtooth portion of the combined current is drawn from the node along a sawtooth current path to generate the sawtooth voltage, and
wherein a staircase portion of the combined current is drawn from the node along a staircase current path to generate the staircase current.

7. The system of claim 6, wherein the combination circuitry further comprises current mirror circuitry that is configured to mirror the combined current and supply the mirrored combined current to the output circuitry for generation of the soft-start voltage.

8. The system of claim 1, wherein a duration of a ramp-up period of the sawtooth current increases over multiple cycles of the sawtooth current, wherein a duration of a step-up period of the staircase current increases over multiple cycles of the staircase current, and wherein the increase in the ramp-up period is synchronized with the increase in the step-up period.

9. The system of claim 8, wherein the sawtooth current ramps up to a current level over each ramp-up period that is substantially the same as an amount of current that the staircase current steps up at each step-up time.

10. An integrated circuit comprising:
a first circuit configured to receive a soft-start voltage during a start-up operation; and
a second circuit configured to generate the soft-start voltage for the first circuit, wherein the second circuit comprises:
sawtooth circuitry configured to generate a sawtooth current having a sawtooth waveform;
staircase circuitry configured to generate a staircase current having an ascending staircase waveform;
combination circuitry configured to combine the sawtooth current and the staircase current to generate a combined current that continuously ramps up to a level corresponding to a predetermined voltage level; and
output circuitry configured to generate the soft-start voltage based on the combined current.

11. The integrated circuit of claim 10, wherein the first circuit comprises a regulator that is configured to output a regulated direct current (DC) voltage.

12. The integrated circuit of claim 10, wherein a duration of a ramp-up period of the sawtooth current increases over multiple cycles of the sawtooth current, wherein a duration of a step-up period of the staircase current increases over multiple cycles of the staircase current, and wherein the increase in the ramp-up period is synchronized with the increase in the step-up period.

13. An apparatus comprising:
sawtooth circuitry configured to generate a sawtooth current having a sawtooth waveform;
staircase circuitry configured to generate a staircase current having an ascending staircase waveform;
combination circuitry configured to combine the sawtooth current and the staircase current to generate a combined current that continuously ramps up to a level corresponding to a predetermined voltage level; and
output circuitry configured to generate a soft-start voltage based on the combined current supplied from the combination circuitry.

14. The apparatus of claim 13, wherein the sawtooth circuitry comprises:
a storage device configured to generate a sawtooth voltage having a sawtooth waveform; and
a transistor configured to generate the sawtooth current.

15. The apparatus of claim 14, wherein the sawtooth circuitry further comprises:

descending staircase generation circuitry configured to supply a descending staircase current to the storage device, the descending staircase current having a descending staircase waveform that steps down in current levels at a plurality of step-down times; and pull-down circuitry configured to pull down the sawtooth voltage across the storage device to a floor voltage level at a plurality of pull-down times, the plurality of pull-down times being synchronized with the step-down times, wherein the sawtooth waveform of the sawtooth voltage is generated in response to receipt of the descending staircase current and the sawtooth voltage being pulled down to the floor voltage level by the pull-down transistor.

16. The apparatus of claim 15, wherein the sawtooth circuitry further comprises:

a comparator configured to:
    compare the sawtooth voltage with a reference voltage level; and
    output a pulsed signal in response to a voltage level of the sawtooth voltage reaching the reference voltage level, wherein the pull-down circuit is configured to pull down the sawtooth voltage to the floor voltage level in response to output of the pulsed signal.

17. The apparatus of claim 16, wherein the sawtooth circuitry further comprises:

a digital counter coupled to the comparator, the digital counter configured:
    to count a number of pulses in the pulsed signal output by the comparator; and
    output a pulse number value indicative of the number of pulses, wherein the descending staircase generation circuitry is configured to output the descending staircase current at a current level that corresponds to the pulse number value.

18. The apparatus of claim 13, wherein the combination circuitry comprises a first transistor that is configured to generate the combined current and supply the combined current to a node, wherein generation of the sawtooth current and the staircase current induces the first transistor to generate the combined current, wherein a sawtooth portion of the combined current is drawn from the node along a sawtooth current path to generate the sawtooth voltage, and wherein a staircase portion of the combined current is drawn from the node along a staircase current path to generate the staircase current.

19. The apparatus of claim 18, wherein the combination circuitry further comprises current mirror circuitry that is configured to mirror the combined current and supply the mirrored combined current to the output circuitry for generation of the soft-start voltage.

20. The apparatus of claim 13, wherein a duration of a ramp-up period of the sawtooth current increases over multiple cycles of the sawtooth current, wherein a duration of a step-up period of the staircase current increases over multiple cycles of the staircase current, and wherein the increase in the ramp-up period is synchronized with the increase in the step-up period.

* * * * *